(12) United States Patent (10) Patent No.: US 10,741,666 B2
Chou et al. (45) Date of Patent: Aug. 11, 2020

(54) HIGH ELECTRON MOBILITY TRANSISTOR AND METHOD FOR FORMING THE SAME

(71) Applicant: Vanguard International Semiconductor Corporation, Hsinchu (TW)

(72) Inventors: Cheng-Wei Chou, Taoyuan (TW); Hsin-Chih Lin, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 16/195,309

(22) Filed: Nov. 19, 2018

(65) Prior Publication Data

US 2020/0161447 A1 May 21, 2020

(51) Int. Cl.
*H01L 29/66* (2006.01)
*H01L 21/02* (2006.01)
*H01L 23/552* (2006.01)
*H01L 29/40* (2006.01)
*H01L 29/205* (2006.01)
(Continued)

(52) U.S. Cl.
CPC .... *H01L 29/66462* (2013.01); *H01L 21/0254* (2013.01); *H01L 21/32133* (2013.01); *H01L 23/552* (2013.01); *H01L 29/2003* (2013.01); *H01L 29/205* (2013.01); *H01L 29/401* (2013.01); *H01L 29/41725* (2013.01); *H01L 29/7787* (2013.01)

(58) Field of Classification Search
None
See application file for complete search history.

(56) References Cited

U.S. PATENT DOCUMENTS 6,090,677 A 7/2000 Burke et al.
2009/0140262 A1* 6/2009 Ohki ................. H01L 29/66462
257/76

(Continued)

FOREIGN PATENT DOCUMENTS

TW 200725704 A 7/2007
TW 200735164 A 9/2007
TW 201244083 A1 11/2012

OTHER PUBLICATIONS

Taiwanese Office Action and Search Report, dated Mar. 18, 2019, for Taiwanese Application No. 107117924.

(Continued)

*Primary Examiner* — Moin M Rahman
(74) *Attorney, Agent, or Firm* — Birch, Stewart, Kolasch & Birch, LLP (57) ABSTRACT

A method for forming a high electron mobility transistor (HEMT) includes forming a buffer layer on a transparent substrate. The method further includes forming a barrier layer on the buffer layer. A channel region is formed in the buffer layer adjacent to the interface between the buffer layer and the barrier layer. The method further includes forming a dielectric layer on the barrier layer. The method further includes forming source/drain electrodes through the dielectric layer and the barrier layer and disposed on the buffer layer. The method further includes forming a shielding layer conformally covering the dielectric layer and the source/drain electrodes. The method further includes performing a thermal process on the source/drain electrodes.

10 Claims, 9 Drawing Sheets

(51) Int. Cl.
*H01L 29/778* (2006.01)
*H01L 29/417* (2006.01)
*H01L 29/20* (2006.01)
*H01L 21/3213* (2006.01)

(56) References Cited

U.S. PATENT DOCUMENTS

| | | |
|---|---|---|
| 2009/0230482 A1 | 9/2009 | Kato et al. |
| 2012/0112202 A1 | 5/2012 | Hwang et al. |
| 2014/0117410 A1 | 5/2014 | Li et al. |
| 2015/0236101 A1* | 8/2015 | Chiang ............... H01L 29/2003 257/194 |
| 2016/0233325 A1* | 8/2016 | Bera .................. H01L 29/7786 |
| 2016/0308023 A1* | 10/2016 | Hsu ...................... H01L 29/267 |
| 2017/0033210 A1 | 2/2017 | Curatola et al. |
| 2018/0138306 A1 | 5/2018 | Jeon et al. |
| 2020/0027950 A1* | 1/2020 | Zhu .................... H01L 21/3083 |

OTHER PUBLICATIONS

Taiwanese Office Action and Search Report dated Dec. 14, 2018, for corresponding Taiwanese Application No. 107117924.

\* cited by examiner

HIGH ELECTRON MOBILITY TRANSISTOR AND METHOD FOR FORMING THE SAME

BACKGROUND

Technical Field

The disclosure relates to a semiconductor technology, and more particularly to a high electron mobility transistor (HEMT).

Description of the Related Art

High electron mobility transistors (HEMT) are widely applied in high-power semiconductor devices due to their many advantages, which include a high breakdown voltage and a high output voltage.

Traditionally, high electron mobility transistors are formed by stacking III-V semiconductors. However, the resistance of the heterojunction formed between the source/drain electrodes and III-V semiconductors is extremely high, and a high-temperature thermal process is needed to diffuse the metal and an Ohmic contact is formed to reduce the contact resistance (Rc). However, when the III-V semiconductors and the substrate are both transparent materials, the temperature sensor may not operate normally, and fail to form the ohmic contact. Therefore, the resistance may not be effectively reduced.

Although existing high electron mobility transistors have generally been adequate for their intended purposes, they have not been entirely satisfactory in all respects and need to be improved. In particular, the formation of a good ohmic contact in high electron mobility transistors needs to be improved.

BRIEF SUMMARY

The present disclosure provides a method for forming a high electron mobility transistor (HEMT). The method includes forming a buffer layer on a transparent substrate. The method further includes forming a barrier layer on the buffer layer. A channel region is formed in the buffer layer adjacent to the interface between the buffer layer and the barrier layer. The method further includes forming a dielectric layer on the barrier layer. The method further includes forming source/drain electrodes through the dielectric layer and the barrier layer and disposed on the buffer layer. The method further includes forming a shielding layer conformally covering the dielectric layer and the source/drain electrodes. The method further includes performing a thermal process on the source/drain electrodes.

The present disclosure also provides a high electron mobility transistor (HEMT). The high electron mobility transistor includes a buffer layer disposed on a transparent substrate. The high electron mobility transistor further includes a barrier layer disposed on the buffer layer. A channel region is disposed in the buffer layer adjacent to the interface between the buffer layer and the barrier layer. The high electron mobility transistor further includes a dielectric layer disposed on the barrier layer. The high electron mobility transistor further includes source/drain electrodes through the dielectric layer and the barrier layer and disposed on the buffer layer. The high electron mobility transistor further includes a shielding layer covering the source/drain electrodes.

A detailed description is given in the following embodiments with reference to the accompanying drawings.

BRIEF DESCRIPTION OF DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Herein, the terms "around," "about," "substantial" usually mean within 20% of a given value or range, preferably within 10%, and better within 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

Although some embodiments are discussed with operations performed in a particular order, these operations may be performed in another logical order. In different embodiments, additional operations can be provided before, during, and/or after the stages described the present disclosure. Some of the stages that are described can be replaced or eliminated for different embodiments. Additional features can be added to the semiconductor structure in the present disclosure. Some of the features described below can be replaced or eliminated for different embodiments.

The embodiments of the present disclosure provide a method for forming a high electron mobility transistor (HEMT). When forming an ohmic contact between the source/drain electrodes and the channel layer by a high-temperature thermal process, a shielding layer is formed on the device to avoid high-temperature light penetrating through the transparent III-V semiconductor and the transparent substrate, making the temperature sensor under the substrate detects abnormally and a good ohmic contact cannot be formed and the resistance cannot be reduced.

Figure 1:
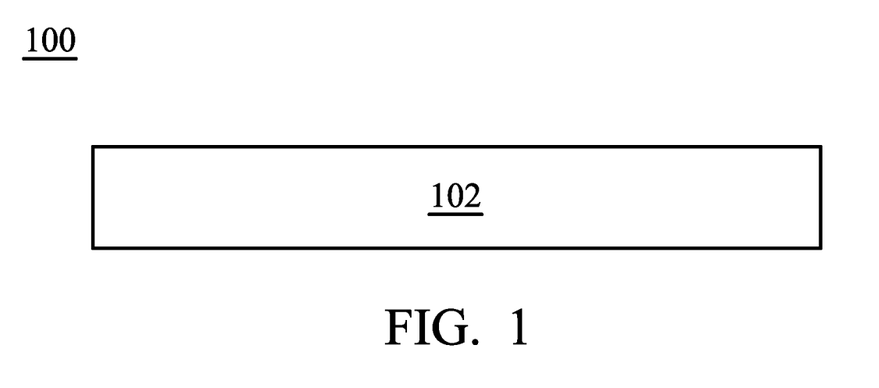
FIGS. 1-9 are cross-sectional representations of various stages of forming a high electron mobility transistor in accordance with some embodiments.

FIGS. 1-9 are cross-sectional representations of various stages of forming a high electron mobility transistor 100 in accordance with some embodiments of the present disclosure. As shown in FIG. 1, a substrate 102 is provided. In some embodiments, the substrate 102 may be an $Al_2O_3$ (sapphire) substrate. Moreover, the semiconductor substrate may also be elementary semiconductors including Si or Ge; compound semiconductors including GaN, SiC, GaAs, GaP, InP, InAs, and/or InSb; alloy semiconductors including SiGe, GaAsP, AlInAs, AlGaAs, GaInAs, GaInP, and/or GaInAsP, or a combination thereof. In some embodiments, the substrate 102 may be a single crystal substrate, a multi-layer substrate, a gradient substrate, other suitable substrates, or a combination thereof. Moreover, the substrate 102 may also be a semiconductor on insulator (SOI) substrate. The above SOI substrate may include a base plate, a buried oxide (BOX) layer disposed on the base plate, or a semiconductor layer disposed on the buried oxide (BOX) layer. In some embodiments, the substrate 102 is a transparent substrate. In the present disclosure, the transparent substrate 102 refers to a substrate 102 having a transmittance of more than 10% (for example, 10% to 99%) for a light having a wavelength of between 300 nm and 2500 nm.

Figure 2:
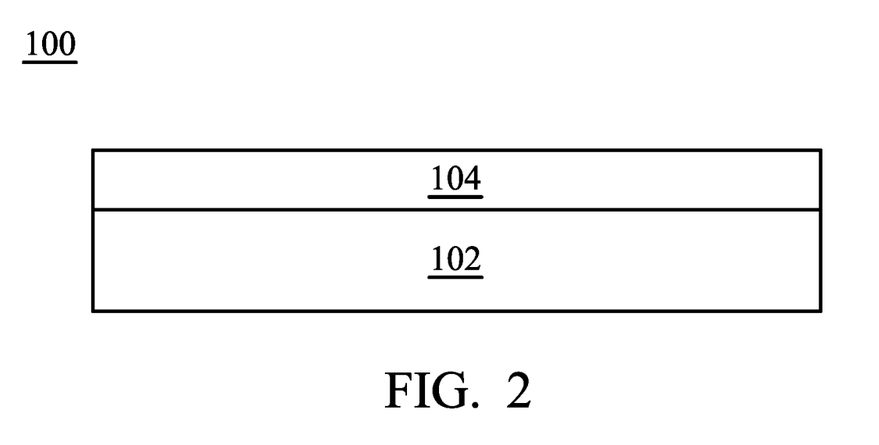

Next, as shown in FIG. 2, a buffer layer 104 is formed on the substrate 102. In some embodiments, the buffer layer 104 includes a III-V semiconductor such as GaN. The buffer layer 104 may also include AlGaN, AlN, GaAs, GaInP, AlGaAs, InP, InAlAs, InGaAs, other suitable III-V semiconductor materials, or a combination thereof. In some embodiments, the buffer layer 104 may be formed on the substrate 102 by molecular-beam epitaxy (MBE), metalorganic chemical vapor deposition (MOCVD), hydride vapor phase epitaxy (HVPE), other suitable methods, or a combination thereof.

Figure 3:
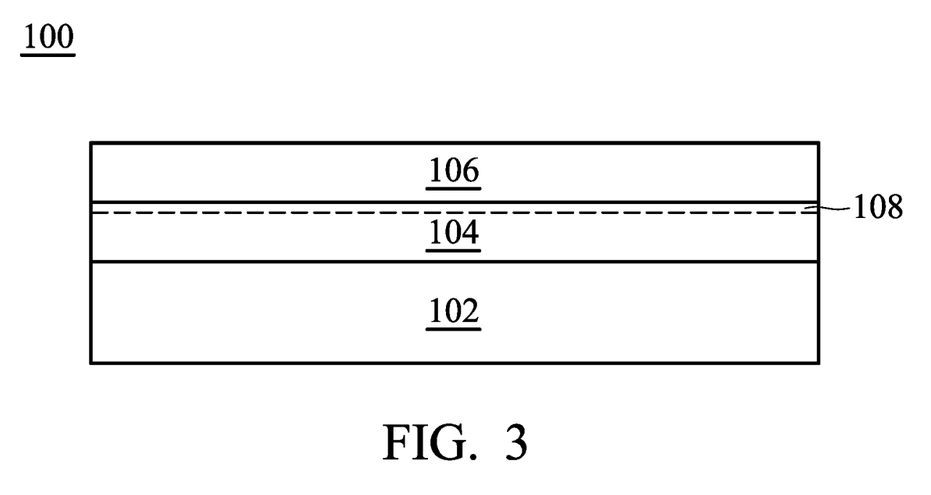

Next, as shown in FIG. 3, a barrier layer 106 is formed on the buffer layer 104. In some embodiments, the barrier layer 106 includes a different material than that of the buffer layer 104. The barrier layer 106 may include III-V semiconductors such as $Al_xGa_{1-x}N$, where 0<x<1. The barrier layer 106 may also include GaN, AlN, GaAs, GaInP, AlGaAs, InP, InAlAs, InGaAs, other suitable III-V materials, or a combination thereof. In some embodiments, the barrier layer 106 may be formed on the buffer layer 104 by molecular-beam epitaxy (MBE), metalorganic chemical vapor deposition (MOCVD), hydride vapor phase epitaxy (HVPE), other suitable methods, or a combination thereof.

Since the materials of the buffer layer 104 and the barrier layer 106 are different, the band gaps are different, and a heterojunction is formed at the interface between the buffer layer 104 and the barrier layer 106. The band bends at the heterojunction, and a quantum well is formed at the deep of the conduction band. The electrons produced by piezoelectricity are confined in the quantum well. Therefore, a two-dimensional electron gas (2DEG) is formed at the interface between the buffer layer 104 and the barrier layer 106, and a conducting current is formed. As shown in FIG. 3, a channel region 108 is formed at the interface between the buffer layer 104 and the barrier layer 106. The channel region 108 is where the conducting current is formed by the two-dimensional electron gas (2DEG).

Figure 4:
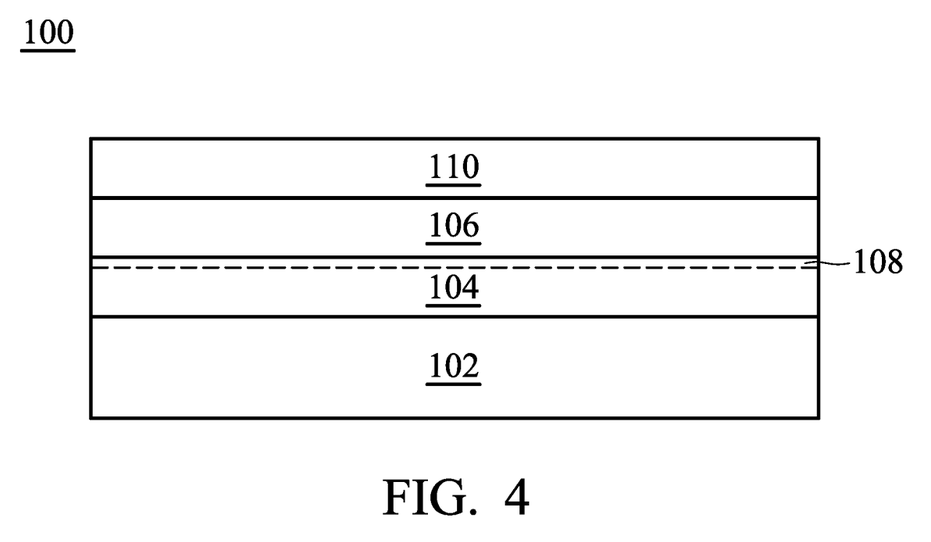

Next, as shown in FIG. 4, a dielectric layer 110 is formed on the barrier layer 106. In some embodiments, the dielectric layer 110 is oxide. In some embodiments, the dielectric layer 110 includes $SiO_2$, $SiN_3$, SiON, $Al_2O_3$, MgO, $Sc_2O_3$, $HfO_2$, HfSiO, HfSiON, HfTaO, HfTiO, HfZrO, LaO, ZrO, $TiO_2$, $ZnO_2$, $ZrO_2$, $AlSiN_3$, SiC, $Ta_2O_5$, other suitable dielectric materials, or a combination thereof. In some embodiments, the dielectric layer 110 may be formed by chemical vapor deposition (CVD) (e.g., plasma enhanced chemical vapor deposition (PECVD), high density plasma chemical vapor deposition (HDPCVD)), atomic layer deposition (ALD), and/or other suitable techniques to deposit dielectric materials. In some embodiments, the dielectric layer 110 may be thermal grown by a thermal oxidation process in oxygen-containing ambient or nitrogen-containing ambient (e.g. NO or $N_2O$). The dielectric layer 110 may reduce the leakage current of the subsequently formed gate, enlarge the durable voltage range of the gate, and further decrease the channel resistance.

Figure 5:
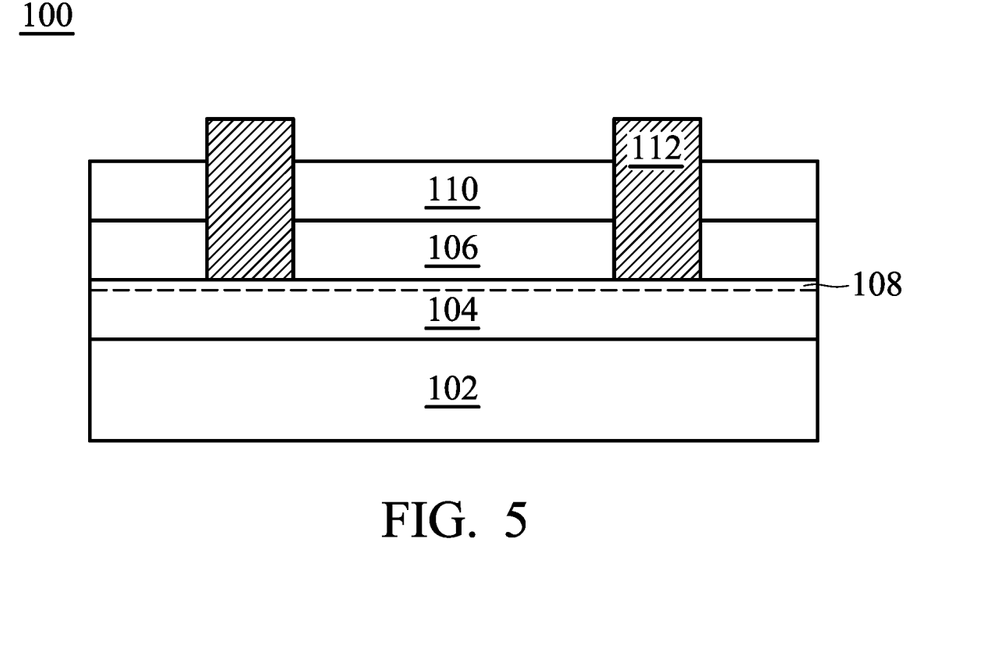

Next, as shown in FIG. 5, source/drain electrodes 112 are formed through the dielectric layer 110 and the barrier layer 106 and disposed on the buffer layer 104. In some embodiments, the source/drain electrodes 112 may respectively include Ti, Al, W, Au, Pd, other suitable metals, their alloy, or a combination thereof. In some embodiments, the source/drain electrodes openings are etched in the dielectric layer 110 and the barrier layer 106 by a lithography process and an etching process, and conductive materials are filled in the source/drain electrodes openings by chemical vapor deposition (CVD), physical vapor deposition (PVD) (such as evaporation or sputtering), electroplating, atomic layer deposition (ALD), other suitable methods, or a combination thereof. The conductive material outside the source/drain electrodes openings is then removed by an etching process, and the source/drain electrodes 112 are formed.

It should be noted that, the depth of the source/drain electrodes 112 shown in FIG. 5 is merely an example, and the present disclosure is not limited thereto. In some embodiments, the bottom surface of the source/drain electrodes 112 is level with the interface between the buffer layer 104 and the barrier layer 106. In some other embodiments, the bottom surface of the source/drain electrodes 112 is above the interface between the buffer layer 104 and the barrier layer 106. In some other embodiments, the bottom surface of the source/drain electrodes 112 is below the interface between the buffer layer 104 and the barrier layer 106.

In some embodiments, after the source/drain electrode openings are formed and before the conductive material is filled to form the source/drain electrodes 112, a passivation layer is conformally formed lining between the source/drain electrodes 112, the dielectric layer 110, and the barrier layer 106 (not shown). The passivation layer may include $SiO_2$, $SiN_3$, SiON, $Al_2O_3$, AlN, polyimide (PI), benzocyclobutene (BCB), polybenzoxazole (PBO), other insulating materials, or a combination thereof. In some embodiments, the passivation layer is formed by metalorganic chemical vapor deposition (MOCVD), chemical vapor deposition, other suitable methods, or a combination thereof. The passivation layer may protect the films underneath, and provide physical passivation and structure support.

Figure 6:
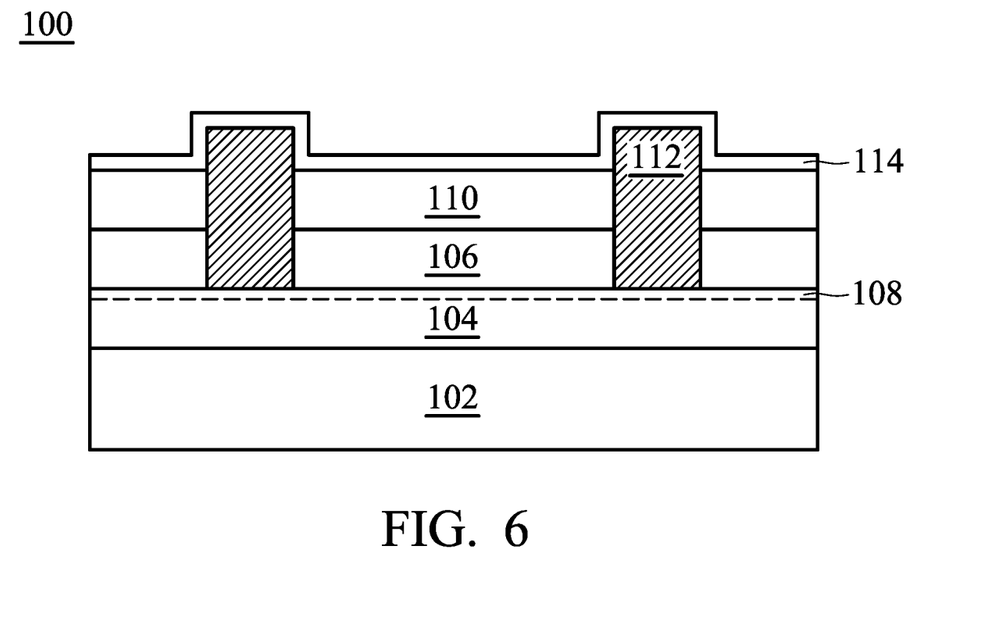

Next, as shown in FIG. 6, shielding layer 114 is formed conformally covering the dielectric layer 110 and the source/drain electrodes 112. In some embodiments, the shielding layer 114 includes TiN. The shielding layer 114 may also include Al, Ag, Cu, AlCu, Pt, W, Ru, Ni, TaN, TiAlN, TiW, TiO, $TiO_2$, other light blocking materials, or a combination thereof. In some embodiments, the shielding layer 114 may be formed by depositing light blocking materials by physical vapor deposition (PVD) (such as evaporation or sputtering), atomic layer deposition (ALD), electroplating, other suitable processes, or a combination thereof. The shielding layer 114 may use a material having a transmittance of less than 10% (for example, 0% to 10%) for a light having a wavelength of between 300 nm and 2500 nm. The shielding layer 114 may have a thickness of between 100 Å and 2000 Å, which may vary from the transmittance characteristics of the selected material. If the shielding layer 114 is too thick, the film may crack or peel due to overhang. If the shielding layer 114 is too thin, the shielding effect may not be sufficient.

Figure 7:
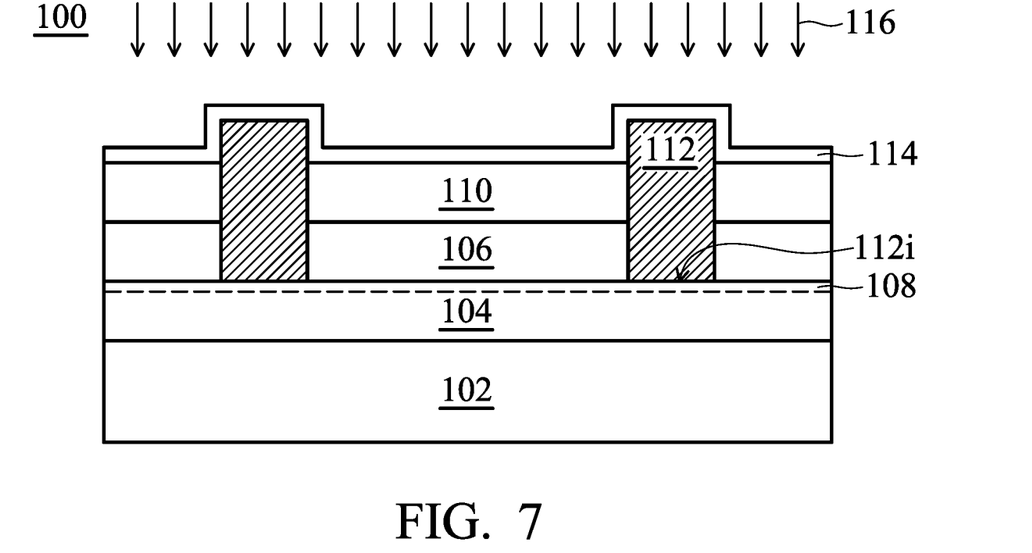

Next, as shown in FIG. 7, a thermal process 116 is performed on the source/drain electrodes 112. Due to the high temperature of the thermal process 116, the metal in the source/drain electrodes 112 will diffuse to the channel region 108. An ohmic contact is formed at the interface 112$i$ between the source/drain electrodes 112 and the channel region 108, and the resistance of the interface 112$i$ between the source/drain electrodes 112 and the channel region 108 may be reduced. In some embodiments, the thermal process 116 use an infrared light having a wavelength of between 700 nm and 2500 nm. The thermal process 116 has a temperature of between 500° C. and 1000° C., and a duration of between 10 seconds and 120 seconds. If the temperature of the thermal process 116 is too high or its duration is too long, it may cause worse device characteristics and a high resistance interface is formed due to the by-product of a high-temperature or a long-time reaction. If the temperature of the thermal process 116 is too low or its duration is too short, a good ohmic contact may not be formed at the interface 112$i$ between the source/drain electrodes 112 and the channel region 108.

As shown in FIG. 7, since the shielding layer 114 is formed on the dielectric layer 110 and the source/drain electrodes 112 before performing the thermal process 116, the heating light used in the thermal process 116 is less likely to penetrate the substrate 102 and the structures on it. Therefore, the temperature sensor at the bottom of the wafer is less likely to detect the temperature abnormally. Therefore, a good ohmic contact may be formed at the interface 112$i$ between the source/drain electrodes 112 and the channel region 108, and the resistance is further reduced.

Figure 8:
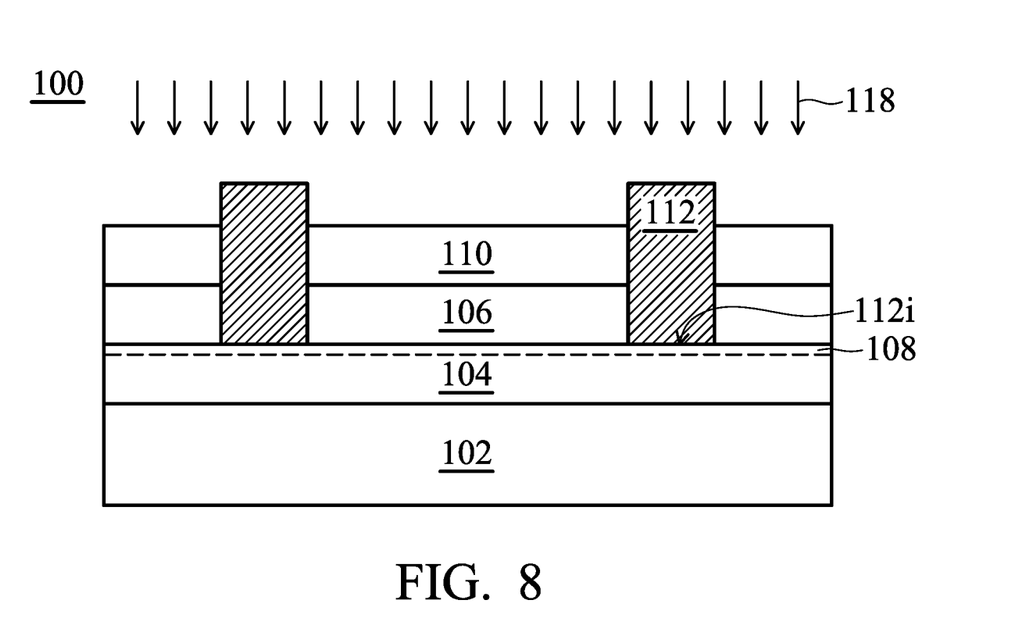

Next, as shown in FIG. 8, the shielding layer 114 is removed by an etching process 118. In some embodiments, the etching process 118 may include a dry etching process, a wet etching process, reactive ion etching (RIE), and/or other suitable etching processes. For example, the dry etching process may be performed by an oxygen-containing gas, a fluorine-containing gas (such as $CF_4$, $SF_6$, $CH_2F_2$, $CHF_3$, and/or $C_2F_6$), a chlorine-containing gas (such as $Cl_2$, $CHCl_3$, $CCl_4$, and/or $BCl_3$), bromine-containing gas (such as HBr and/or $CHBR_3$), iodine-containing gas, other suitable gas and/or plasma, and/or a combination thereof. For example, the wet etching process may be performed in wet etching etchant including diluted hydrofluoric acid (DHF), potassium hydroxide (KOH), ammonia, hydrofluoric acid (HF), nitric acid ($HNO_3$), and/or acetic acid ($CH_3COOH$), or other suitable wet etching etchants. In some embodiments, the etching process 118 removes the shielding layer 114 completely. The remaining shielding layer 114 between the source/drain electrodes 112 and contacting different source/drain electrodes 112 may cause an unwanted short-circuit.

Figure 9:
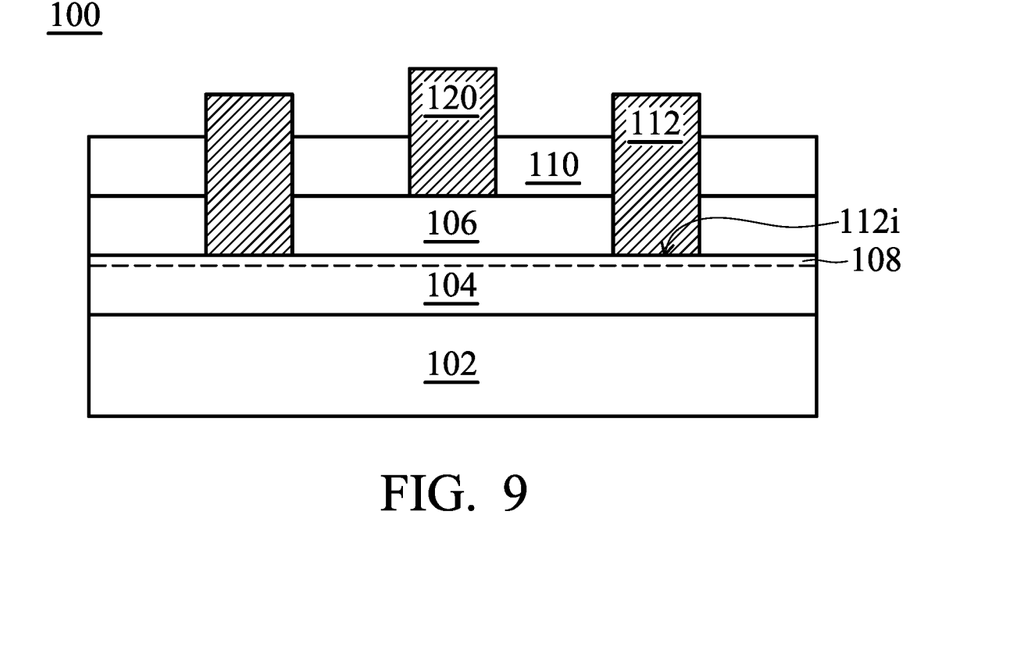

Next, as shown in FIG. 9, a gate electrode 120 is formed on the barrier layer 106. In some embodiments, the gate electrode 120 may include polysilicon, metal (such as tungsten, titanium, aluminum, copper, molybdenum, nickel, platinum, the like, or a combination thereof), metal alloys, metal-nitrides (such as tungsten nitride, molybdenum nitride, titanium nitride, tantalum nitride, the like, or a combination thereof), metal-silicides (such as tungsten silicide, titanium silicide, cobalt silicide, nickel silicide, platinum silicide, erbium silicide, the like, or a combination thereof), metal-oxides (such as ruthenium oxide, indium tin oxide, the like, or a combination thereof), other applicable conductive materials, or a combination thereof. In some embodiments, a gate opening may be formed in the dielectric layer 110 by a lithography and an etching process. An conductive material is deposited on the dielectric layer 110 and is filled in the above gate opening by a chemical vapor deposition (CVD) (such as low pressure chemical vapor deposition (LPCVD), or plasma enhanced chemical vapor deposition (PECVD)), physical vapor deposition (such as resistive heating evaporation, e-beam evaporation, or sputtering), electroplating, physical vapor deposition (PVD), other suitable processes, or a combination thereof. The conductive material outside the gate opening is then removed by an etching process, and the gate electrode 120 is formed.

As mentioned above, before performing the thermal process, a shielding layer is covered on the high electron mobility transistor to avoid the heating light of the thermal process penetrating the high electron mobility transistor, causing abnormal temperature detection. Normal heating process may form a good ohmic contact at the interface between the source/drain electrode and the channel region, reducing the contact resistance.

Figure 10:
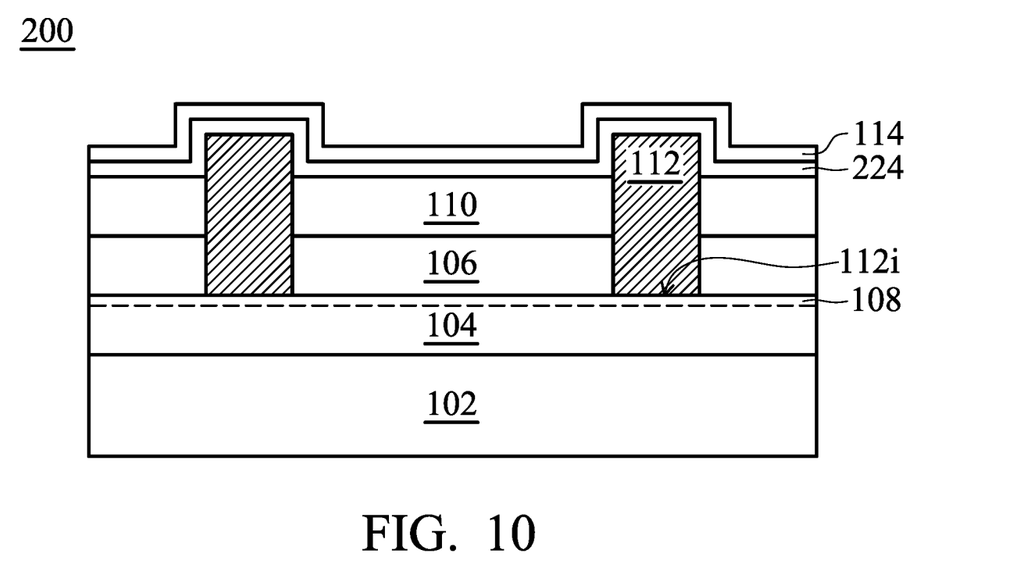
FIGS. 10-12 are cross-sectional representations of various stages of forming a high electron mobility transistor in accordance with some other embodiments.
Figure 11:
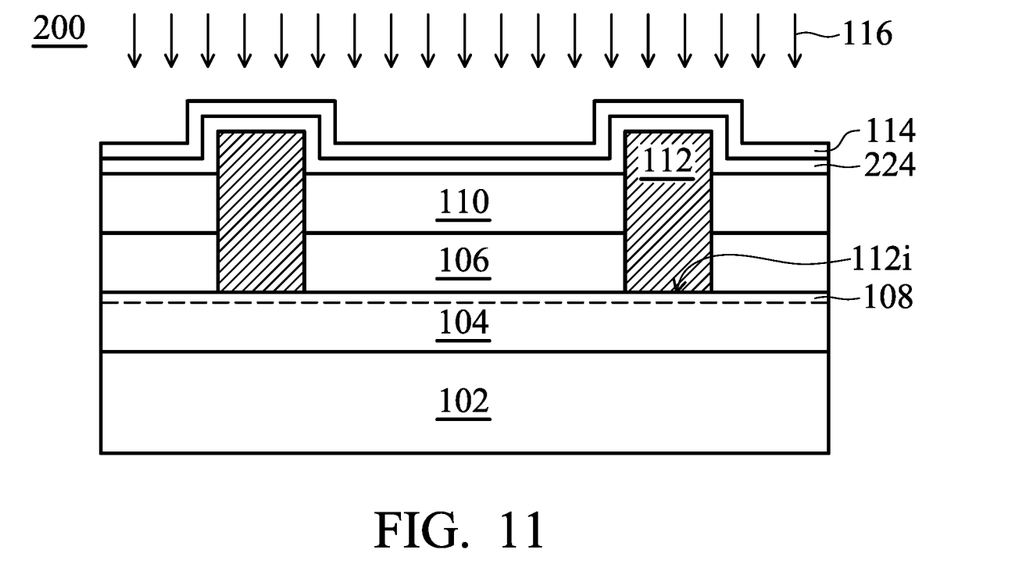
Figure 12:
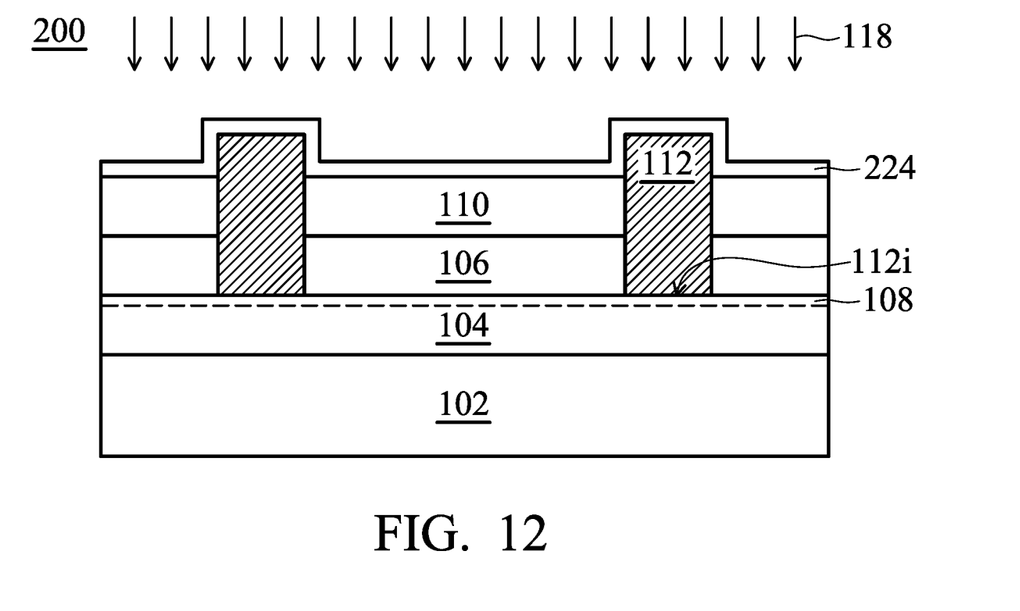

FIGS. 10-12 are cross-sectional representations of various stages of forming a high electron mobility transistor 200 in accordance with some embodiments of the present disclosure. Some processes or devices are the same as, or similar to, those described in the embodiments above, and therefore the reference numerals and/or letters may repeat. For the purpose of brevity, the descriptions of these processes and devices are not repeated herein. The difference from the embodiments described above is that, as shown in FIG. 10, before forming the shielding layer 114, an etch stop layer 224 conformally covers the dielectric layer 110 and the source/drain electrodes 112.

In some embodiments, the etch stop layer 224 is oxide. In some embodiments, the etch stop layer 224 includes $SiO_2$, $Si_3N_4$, SiON, $Al_2O_3$, MgO, $Sc_2O_3$, HfO2, HfSiO, HfSiON, HfTaO, HfTiO, HfZrO, LaO, ZrO, $TiO_2$, $ZnO_2$, $ZrO_2$, or $Ta_2O_5$, the like, or a combination thereof. In some embodiments, the etch stop layer 224 may be formed by depositing dielectric materials by chemical vapor deposition (CVD) (such as plasma enhanced chemical vapor deposition (PECVD), high density plasma chemical vapor deposition (HDPCVD)), atomic layer deposition (ALD), and/or other suitable techniques to deposit dielectric materials. In some embodiments, the etch stop layer 224 may have a thickness of between 100 Å and 2000 Å. If the etch stop layer 224 is too thick, the overhang may cause a hole or the film may be cracked due to great stress. If the etch stop layer 224 is too thin, it may not be sufficient to make subsequent etching process stop on the layer.

Next, as shown in FIG. 11, a thermal process 116 is performed on the source/drain electrodes 112. Due to the high temperature of the thermal process 116, the metal in the source/drain electrodes 112 will diffuse to the channel region 108. An ohmic contact is formed at the interface 112i between the source/drain electrodes 112 and the channel region 108. Since the shielding layer 114 is formed on the dielectric layer 110 and the source/drain electrodes 112 before performing the thermal process 116, the heating light used in the thermal process 116 is less likely to penetrate the high electron mobility transistor 100. Therefore, the temperature is less likely to be detected abnormally. Therefore, a good ohmic contact may be formed at the interface 112i between the source/drain electrodes 112 and the channel region 108, and the resistance is further reduced.

Next, as shown in FIG. 12, the shielding layer 114 is removed by an etching process 118. In some embodiments, after the shielding layer 114 is removed by the etching process 118, the remaining etch stop layer 224 covers the source/drain electrodes 112. Therefore, the thickness of the source/drain may not change due to the etching process 118, resulting in a uniform thickness of the source/drain electrodes 112 after the etching process 118. In some embodiments, the dielectric layer 110 and the etch stop layer 224 are both oxides. In some embodiments, the etching rate of the etch stop layer 224 and the dielectric layer 110 during the etching process 118 is much less than that of the shielding layer 114 (e.g., the etching rate ratio is 1:3) in order to avoid the source/drain electrodes 112 being over-etched during the etching process 118. In some embodiments, the etching rate of the etch stop layer 224 and the dielectric layer 110 during the etching process 118 are different in order to avoid the dielectric layer 110 is over-etched during the etching process 118.

In some embodiments, after the etching process 118, an oxide layer may further conformally cover on the etch stop layer 224 by a deposition process or a thermal oxide process (not shown). However, even the etch stop layer 224 is an oxide, since the etch stop layer 224 has experienced the thermal process 116, and the oxide layer has not experienced the thermal process 116, the etching rate of the etch stop layer 224 and the oxide layer in the subsequent etching process are also different, and over-etching the etch stop layer 224 in the subsequent etching process may be prevented.

In the embodiment shown in FIGS. 10 to 12, before performing the thermal process, an etch stop layer and a shielding layer are covered on the high electron mobility transistor to avoid the heating light of the thermal process penetrating the high electron mobility transistor, causing abnormal temperature detection. Normal heating process may form a good ohmic contact at the interface between the source/drain electrodes and the channel region, reducing the contact resistance. The etch stop layer may further avoid over-etching the underneath source/drain electrodes and dielectric layer when removing the shielding layer, resulting in a uniform thickness of the source/drain electrodes.

Figure 13:
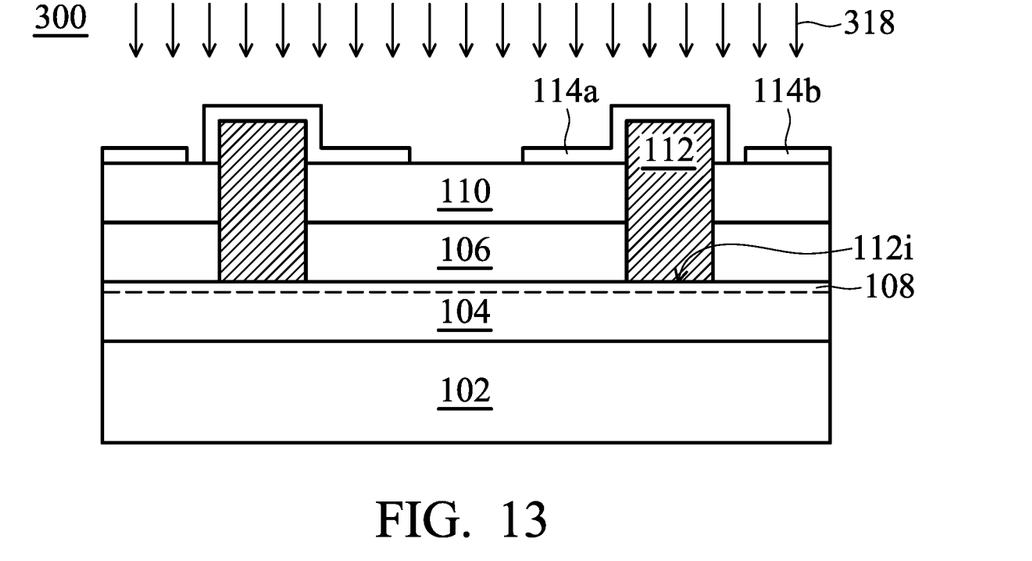
FIGS. 13 and 14 are cross-sectional representations of various stages of forming a high electron mobility transistor in accordance with some further embodiments.
Figure 14:
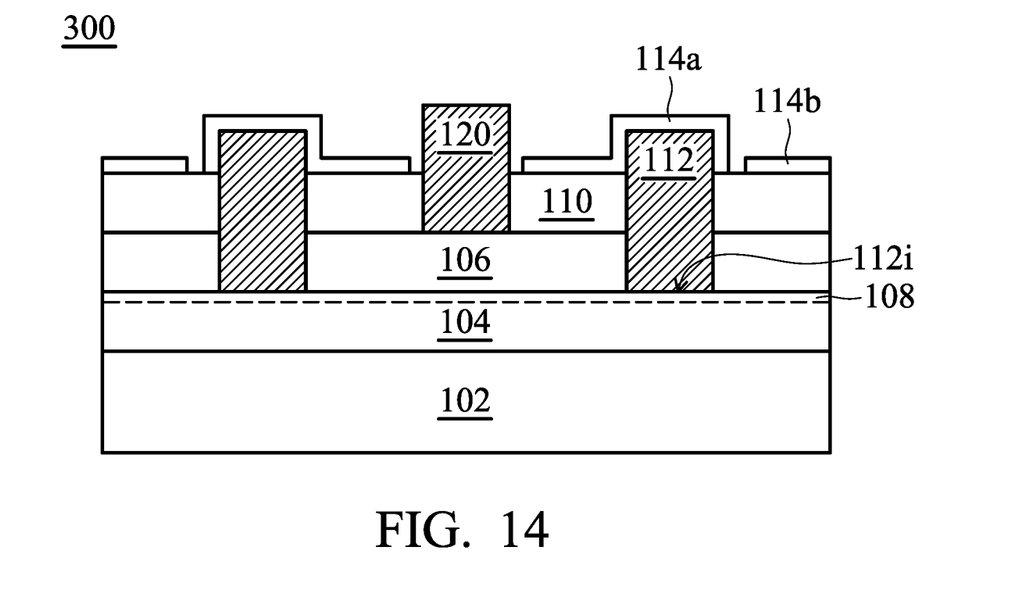

FIGS. 13-14 are cross-sectional representations of various stages of forming a high electron mobility transistor 300 in accordance with some embodiments of the present disclosure. Some processes or devices are the same as, or similar to, those described in the embodiments above, and therefore the reference numerals and/or letters may repeat. For the purpose of brevity, the descriptions of these processes and devices are not repeated herein. The difference from the embodiments described above is that, as shown in FIG. 13, after performing the thermal process 116, the shielding layer 114 is optionally removed by an etching process 318. In some embodiments, the shielding layer 114 is optionally removed by a patterning process. The patterning process may include photoresist coating (such as spin-on coating), soft baking, mask aligning, pattern exposure, post-exposure baking, photoresist development, rinsing and drying (such as hard baking), other suitable techniques, or a combination thereof. The etching process may include a dry etching process (such as reactive ion etching (RIE) or an anisotropic plasma etching method), wet etching, or a combination thereof. After removing the shielding layer 114, the remaining shielding layer 114 respectively includes the shielding layer 114a covering the two sidewalls of the source/drain electrodes 112 and the shielding layer 114b only covering the dielectric layer 110.

Next, as shown in FIG. 14, a gate electrode 120 is formed on the barrier layer 106. In some embodiments, the remaining shielding layers 114a and 114b do not contact the gate electrode 120. If the remaining shielding layers 114a and 114b remain between the source/drain electrodes 112 and the gate electrode 120 and contact different source/drain electrodes 112 and gate electrode 120, it may cause an unwanted short-circuit. As well as shielding the light during the thermal process 116, the remaining shielding layer 114b may also be used in subsequent routing.

In the embodiment shown in FIGS. 13 to 14, before performing the thermal process, a shielding layer is covered on the high electron mobility transistor to avoid the heating light penetrating the high electron mobility transistor, causing abnormal temperature detection. Normal heating process may form a good ohmic contact at the interface between the source/drain electrodes and the channel region, reducing the contact resistance. Next, the shielding layer is optionally removed. The remaining partial shielding layer may be used in other subsequent routing, reducing the required cost and time for processing.

Figure 15:
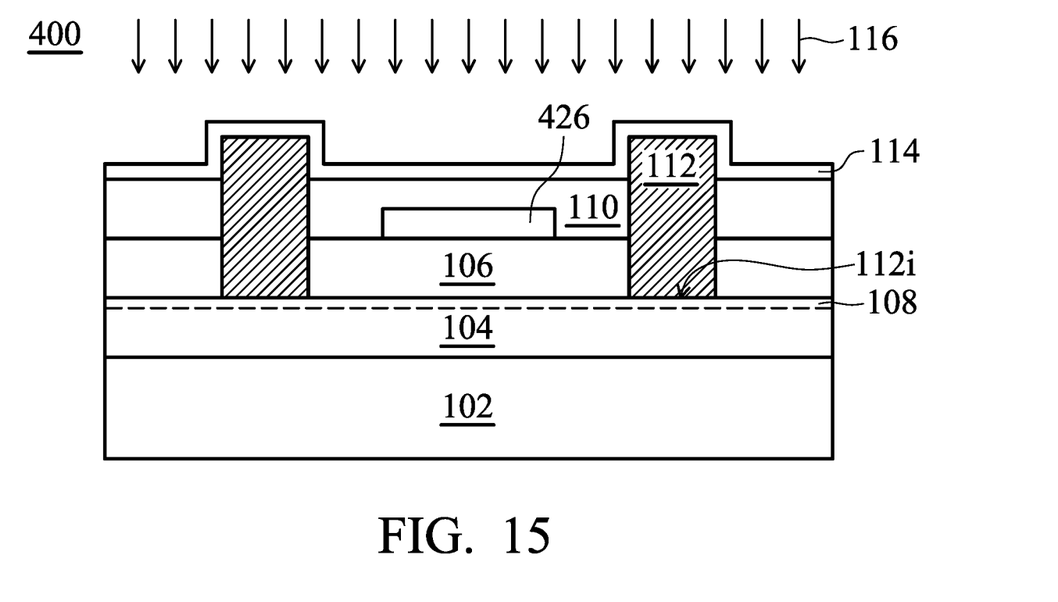
FIGS. 15 and 16 are cross-sectional representations of forming a high electron mobility transistor in accordance with some more embodiments.
Figure 16:
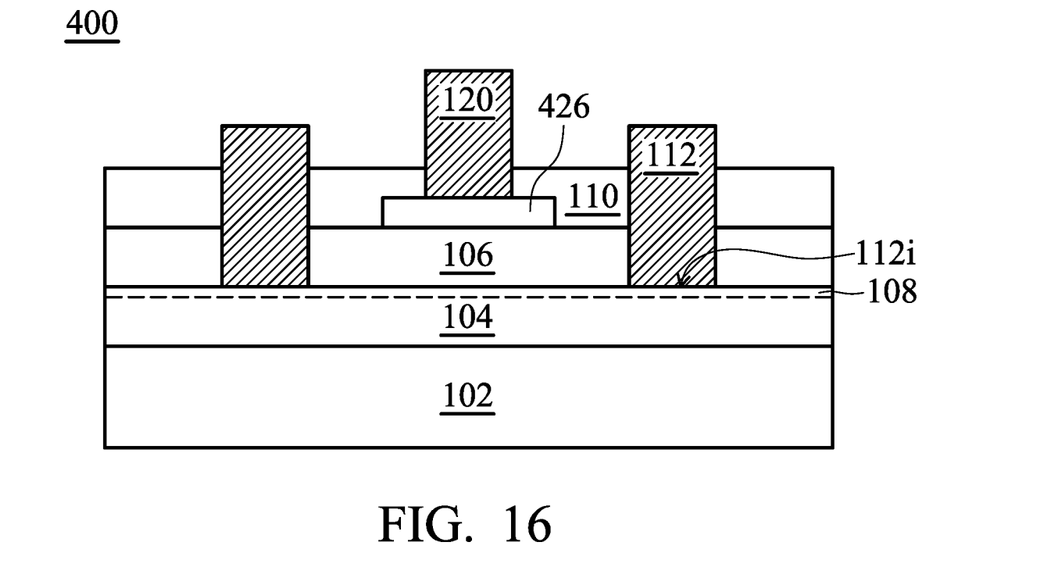

FIGS. 15-16 are cross-sectional representations of various stages of forming a high electron mobility transistor 400 in accordance with some embodiments of the present disclosure. Some processes or devices are the same as, or similar to, those described in the embodiments above, and therefore the reference numerals and/or letters may repeat. For the purpose of brevity, the descriptions of these processes and devices are not repeated herein. The difference from the embodiments described above is that, the high electron mobility transistor described above is turned on without applying a gate voltage, that is, a depletion mode (D-mode) high electron mobility transistor. However, as shown in FIG. 15, before forming the dielectric layer 110, a band adjustment layer 426 is formed on the barrier layer 106 and under the predetermined region of the subsequently formed gate electrode 120. The band adjustment layer 426 is a P-type doped III-V semiconductor, including P-type doped GaN, AlGaN, AlN, GaAs, AlGaAs, InP, InAlAs, or InGaAs. The P-type doping concentration is between about 1e17/cm$^3$ and 1e20/cm$^3$. In some embodiments, the P-type doped III-V semiconductor may be deposited by molecular-beam epitaxy (MBE), metalorganic chemical vapor deposition (MOCVD), chemical vapor deposition (CVD), or hydride vapor phase epitaxy (HVPE). The P-type doped III-V semiconductor is then patterned to form the band adjustment layer 426 by, for example, a lithography process and an etching process.

Next, as shown in FIG. 15, the shielding layer 114 is covered on the high electron mobility transistor 400, and then the thermal process 116 is performed. Due to the high temperature of the thermal process 116, the metal in the source/drain electrodes 112 will diffuse to the channel region 108. An ohmic contact is formed at the interface 112i between the source/drain electrodes 112 and the channel region 108. Since the shielding layer 114 is formed on the dielectric layer 110 and the source/drain electrodes 112 before performing the thermal process 116, the heating light used in the thermal process 116 is less likely to penetrate the high electron mobility transistor 400. Therefore, the temperature is less likely to be detected inaccurately. Therefore, a good ohmic contact may be formed at the interface 112i between the source/drain electrodes 112 and the channel region 108, and the resistance is further reduced.

Next, as shown in FIG. 16, after removing the shielding layer 114, a gate electrode 120 is formed on the band adjustment layer 426, making these two electrically connected. Since the band adjustment layer 426 is a P-type doped III-V semiconductor, the P-type doping raises the energy bands. Therefore, the quantum well energy at the interface between the buffer layer 104 and the barrier layer 106 is higher than the Fermi level, which results in no two-dimensional electron gas (2DEG) is produced in the channel region 108, and therefore no conducting current is produced. In the above embodiments, since the band adjustment layer 426 may raise the energy band, the high electron mobility transistor 400 may be cut off when no gate voltage is applied. That is, the high electron mobility transistor 400 may be an enhancement mode (E-mode) high electron mobility transistor. Compared to D-mode high electron mobility transistors, E-mode high electron mobility transistors are safer, and the standby power dissipation is lower. Since there is no need to apply a negative bias voltage, the circuit complexity and the production cost may also be reduced.

In the embodiments as shown in FIGS. 15 and 16, before performing the thermal process, a shielding layer is covered on the high electron mobility transistor to avoid the heating light penetrating the high electron mobility transistor, causing abnormal temperature detection. Normal heating process may form a good ohmic contact at the interface between the source/drain electrodes and the channel region, reducing the contact resistance. By forming a band adjustment layer beneath the gate electrode, an enhanced mode (E-mode) high electron mobility transistor which is cut off without applying a gate voltage is formed.

It should be noted that the embodiments of the high electron mobility transistors 100, 200, and 300 are also applicable to the embodiments shown in FIGS. 15 and 16. The band adjustment layer is formed beneath the gate electrode, and an enhanced mode (E-mode) high electron mobility transistor is formed.

Figure 17:
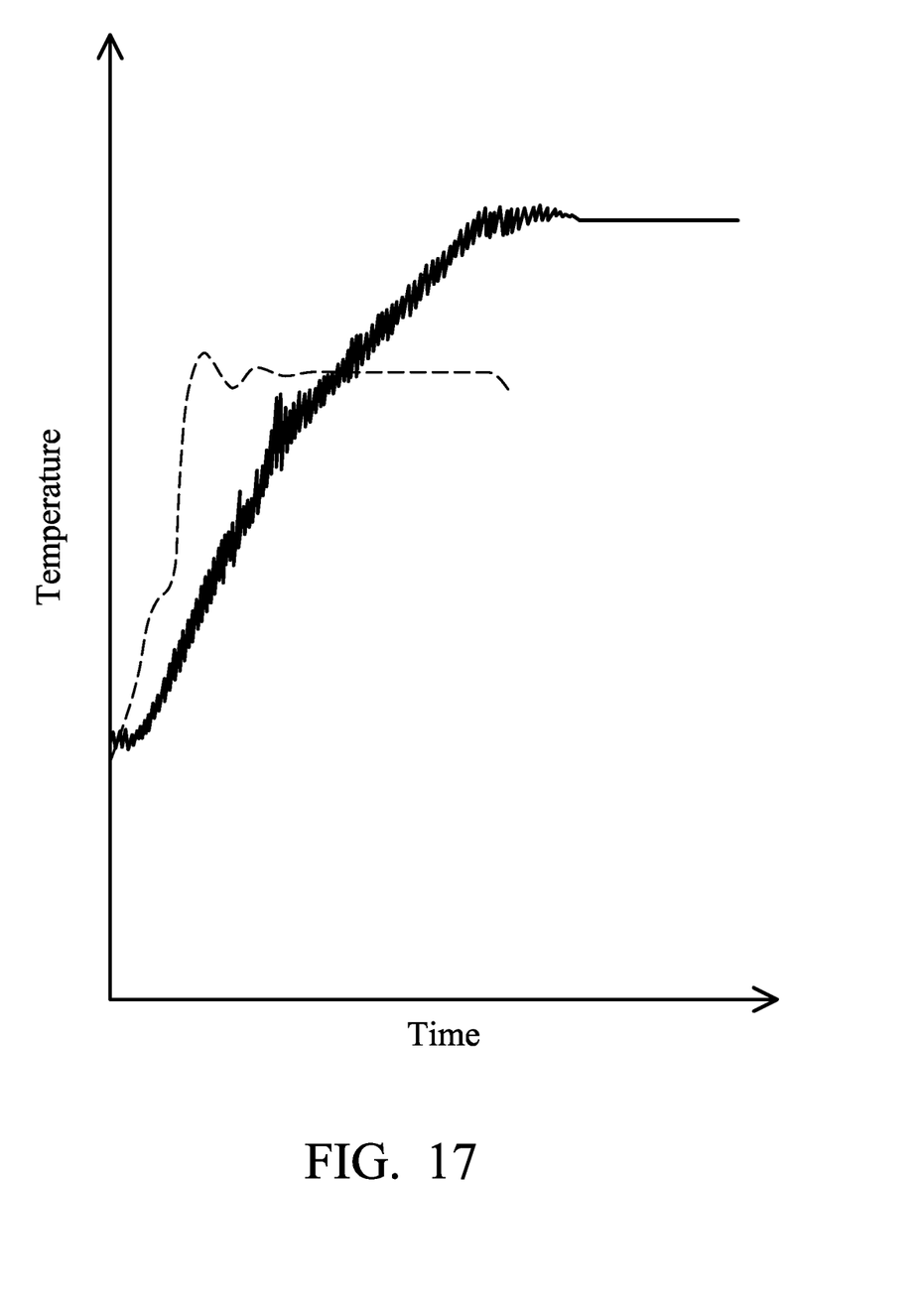
FIG. 17 is a heating curve of forming a high electron mobility transistor in accordance with some embodiments.

FIG. 17 is a heating curve of forming a high electron mobility transistor in accordance with some embodiments. The data with solid lines represents a heating curve without the shielding layer 114. The data with dash lines represents a heating curve with the shielding layer 114.

As shown in FIG. 17, if the shielding layer 114 is not used during performing the thermal process 116, the thermal sensor may abnormally detect easily, and the temperature measured varies and is not stable. The ohmic contact fails to be formed and the resistance may not be reduced. In contrast, with the shielding layer 114, the temperature stably increases. Therefore, the heating process may be heated normally, and a good ohmic contact may be formed at the interface between the source/drain electrodes and the channel region, and the contact resistance may be further reduced.

It should be noted that although some of the benefits and effects are described in the embodiments above, not every embodiment needs to achieve all the benefits and effects.

As mentioned above, in the present disclosure, a method of forming a high electron mobility transistor is provided. Before forming an ohmic contact at the interface between the source/drain electrodes and the channel region by performing the heating process, a light shielding layer is formed on the source/drain electrode and the dielectric layer first to avoid the heating high-temperature light penetrating the high electron mobility transistor and making the temperature detection abnormal. In this way, the thermal process may heat normally, and a good ohmic contact at the interface between the source/drain electrode and the channel region is formed, and the contact resistance is further decreased. Moreover, an etch stop layer may be formed first before forming the light-shielding layer, making the thickness of the source/drain electrodes uniform. In addition, if the shielding layer is removed, the remaining shielding layer may be used for subsequent routing. This method may be applied to form a depletion-mode high electron mobility transistor and an enhanced-mode high electron mobility transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a high electron mobility transistor (HEMT), comprising: forming a buffer layer on a transparent substrate; forming a barrier layer on the buffer layer, wherein a channel region is formed in the buffer layer adjacent to an interface between the buffer layer and the barrier layer; forming a dielectric layer on the barrier layer; forming source/drain electrodes through the dielectric layer and the barrier layer and disposed on the buffer layer; forming a shielding layer conformally covering the dielectric layer and the source/drain electrodes; and performing a thermal process on the source/drain electrodes after forming the shielding layer, wherein the thermal process reduces the resistance of an interface between the source/drain electrodes and the channel region.

2. The method for forming a high electron mobility transistor as claimed in claim 1, further comprising:
completely removing the shielding layer after performing the thermal process.

3. The method for forming a high electron mobility transistor as claimed in claim 1, further comprising:
optionally removing a part of the shielding layer on the dielectric layer after the thermal process, wherein the remaining shielding layer covers the two sidewalls of the source/drain electrodes.

4. The method for forming a high electron mobility transistor as claimed in claim 2, further comprising:

forming an etch stop layer conformally covering the dielectric layer and the source/drain electrodes before forming the shielding layer.

5. The method for forming a high electron mobility transistor as claimed in claim 4, wherein the etch stop layer and the dielectric layer are both oxides, and the etching rates of the etch stop layer and the dielectric layer are different during removal of the shielding layer.

6. The method for forming a high electron mobility transistor as claimed in claim 1, further comprising:
forming a gate electrode on the barrier layer and between the source/drain electrodes.

7. The method for forming a high electron mobility transistor as claimed in claim 6, further comprising:
forming a band adjustment layer on the barrier layer and under a gate electrode predetermined region before forming the gate electrode;
wherein the band adjustment layer is a P-type doped III-V semiconductor.

8. The method for forming a high electron mobility transistor as claimed in claim 1, wherein the thermal process has a temperature of between 500° C. and 1000° C., and the thermal process has a duration of between 10 seconds and 120 seconds.

9. The method for forming a high electron mobility transistor as claimed in claim 1, wherein the shielding layer comprises TiN, Al, Ag, Cu, AlCu, Pt, W, Ru, Ni, TaN, TiAlN, TiW, TiO, $TiO_2$, or a combination thereof.

10. The method for forming a high electron mobility transistor as claimed in claim 1, wherein the shielding layer has a transmittance of less than 10% for a light having a wavelength between 300 nm and 2500 nm.

* * * * *